United States Patent [19]

Harada

[11] Patent Number: 5,128,675
[45] Date of Patent: Jul. 7, 1992

[54] SUPERCONDUCTING DIGITAL TO ANALOG CONVERTER

[75] Inventor: Yutaka Harada, Tokyo, Japan

[73] Assignee: Research Development Corporation of Japan, Tokyo, Japan; a part interest

[21] Appl. No.: 762,341

[22] Filed: Sep. 19, 1991

[30] Foreign Application Priority Data

Sep. 20, 1990 [JP] Japan .................................. 2-251491

[51] Int. Cl.$^5$ ............................................. H03M 1/66
[52] U.S. Cl. ..................................... 341/133; 341/149
[58] Field of Search ............... 341/133, 149, 154, 153, 341/144; 505/827

[56] References Cited

U.S. PATENT DOCUMENTS

| | | | |
|---|---|---|---|
| 4,315,255 | 2/1982 | Harris et al. | 341/133 X |
| 4,551,709 | 11/1985 | Merchant et al. | 341/154 X |
| 4,672,359 | 6/1987 | Silver | 341/133 X |
| 4,977,402 | 12/1990 | Ko | 341/133 |
| 4,983,971 | 1/1991 | Przybysz et al. | 341/133 |

Primary Examiner—Sharon D. Logan
Attorney, Agent, or Firm—Fleit, Jacobson, Cohn, Price, Holman & Stern

[57] ABSTRACT

In a superconducting digital to analog converter, shunt branches of a ladder resistor network are connected to corresponding Josephson devices, the states of which are switched by a digital signal. Currents following through the Josephson devices or load resistors of the Josephson devices are collected to obtain an analog signal corresponding to the digital signal.

6 Claims, 6 Drawing Sheets

SUPERCONDUCTING DIGITAL TO ANALOG CONVERTER

FIELD OF THE INVENTION

This invention relates to a superconducting circuit, especially to a digital to analog converter comprising a ladder resistor network and Josephson devices, the conducting state each of which is switched between a superconducting state and a voltage state.

BACKGROUND OF THE INVENTION

In the field of signal processing, computer processing and signal transmittion processing are carried out through conversion between analog format and digital format. In this field, extremely high speed signal converters, that is, very high speed analog to digital converters or very high speed digital to analog converters, are required in order to make the most of the performance of the computers and signal transmission systems. As typically in the neurocomputers, it has been proposed to use analog signal processing in computers. In this case, the conversion prcesses between analog signals and digital signals take the most part of the computer processing.

By use of the Josephson devices with high speed operation ability, several high performance systems can be constructed. Some analog to digital converters fulfilling the above requirement have been proposed, for instance, in C. A. Hamilton et. al., "Superconducting A/D Converter Using Latching Comparators", IEEE Trans. Magn., Vol. MAG-21, No. 2, pp. 197-199, Mar. 1985 and U.S. Pat. No. 4,956,642. On the other hand, any digital to analog converter fulfilling the above requirement has not been proposed. Such a digital to analog converter is important itself, and further a more complicated functional system such as an analog to digital converter can be constructed by use of the digital to analog converter. Therefore, digital to analog converters having simple construction, high precision and very high processing speed have very wide usability.

SUMMARY OF THE INVENTION

The object of this invention is to realize a digital to analog converter having simple structure and high processing speed by using a switching circuit comprising high speed Josephson devices, and then realize high speed conversion between analog signals and digital signals.

In this invention, shunt branches of a ladder resistor network are connected to corresponding Josephson devices whose states are switched by a digital signal. Currents following through the Josephson devices or load resistors of the Josephson devices are collected to make an analog signal.

BRIEF DESCRIPTION OF THE DRAWINGS

In the drawings, like reference numerals denote like parts in the various views.

DETAILED DESCRIPTION OF THE INVENTION

Hereinbelow, this invention will be described by means of examples.

Figure 1:
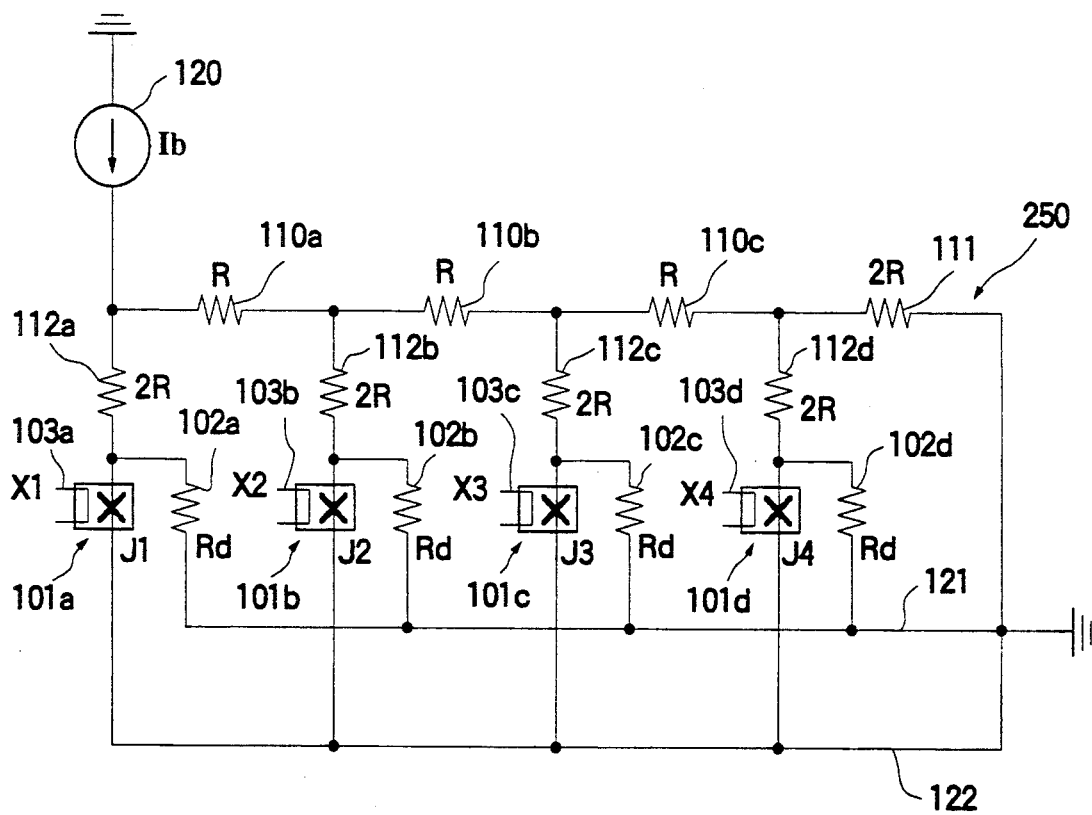
FIG. 1 is a circuit diagram of a first example according to this invention.

FIG. 1 is an example according to this invention. This example of FIG. 1 is a four bit digital to analog converter which has a ladder resistor network comprising weight resistors 110a, 110b, 110c and shunt resistors 112a, 112b, 112c, 112d and 111. The shunt resistors 112a, 112b, 112c and 112d are connected to ends of magnetic flux coupled Josephson devices 101a, 101b, 101c and 101d and ends of load resistors 102a, 102b, 102c and 102d for the Josephson devices, respectively. Other ends of the magnetic coupled Josephson devices 101a, 101b, 101c and 101d are connected to a superconducting output line 122. Other ends of the load resistors 102a, 102b, 102c and 102d are connected to an output line 121. This ladder resistor network 250 is supplied with current I b from a current source 120. The magnetic flux coupled Josephson devices 101a, 101b, 101c and 101d are provided with control current lines 103a, 103b, 103c and 103d, respectively. The maximum superconducting currents(critical currents) of the magnetic flux coupled Josephson devices are controlled by currents flowing through the control current lines. The control current lines 103a, 103b, 103c and 103d are supplied with a digital signal as control signals X1, X2, X3 and X4 to make the magnetic flux coupled Josephson devices 101a, 101b, 101c and 101d a superconducting state or a voltage state.

Figure 2A:
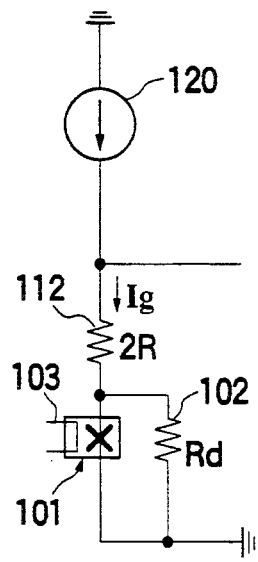
FIGS. 2a-2c are diagrams for illustrating operation of a Josephson device used in this invention.
Figure 2B:
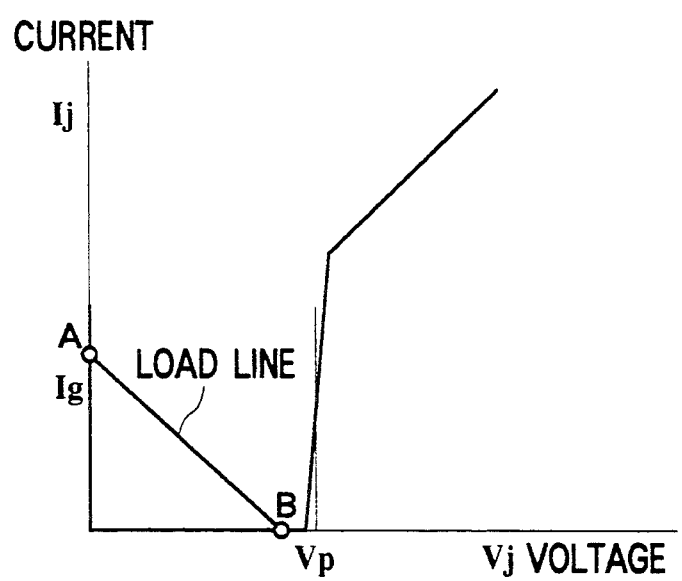
Figure 2C:
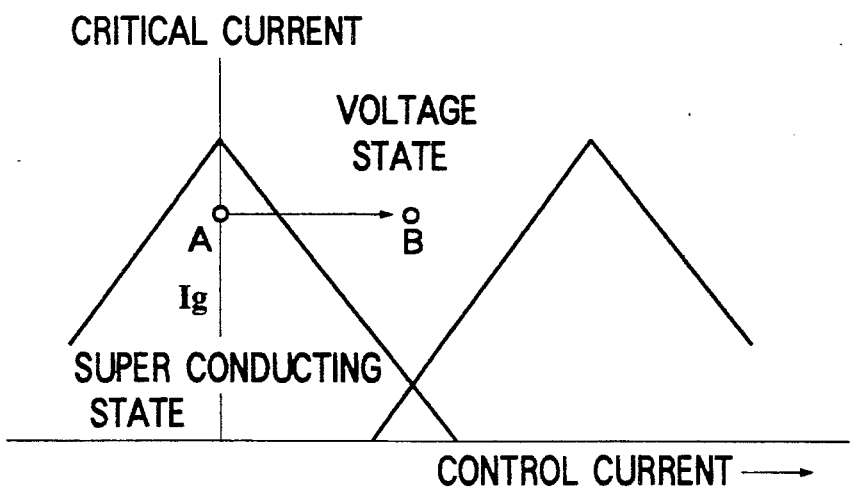
Figure 3:
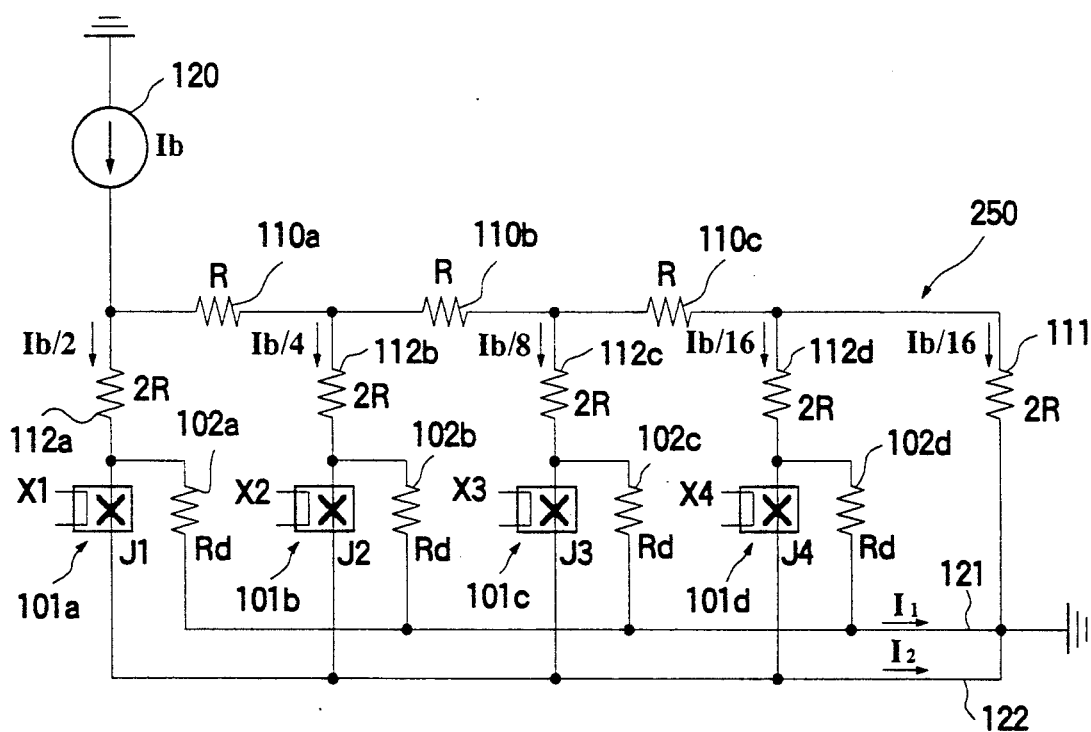
FIG. 3 is a diagram for illustrating operation of the first example shown in FIG. 1.

Circuit operation of the example shown in FIG. 1 is now explained by use of FIGS. 2 and 3. FIG. 2a shows a one-bit portion cut out from FIG. 1. FIG. 2b shows a voltage-current characteristic of the magnetic coupled Josephson device 101 and a load line. FIG. 2c shows a relation between control currents and critical currents of the magnetic flux coupled Josephson device 101. When one bit of a digital signal is not applied to the magnetic flux coupled device 101, bias current I g flows through the magnetic flux coupled Josephson device 101 and the shunt resistor 112, and then the magnetic flux coupled Josephson device 101 is in a superconducting state and the operating point can be represented by the point A in FIGS. 2b and 2c. In this state, a digital signal is applied on the Josephson device 101 through the control line 103. When the operating point is moved to the point B, the Josephson device 101 becomes a voltage state and then the bias current I g flows through the load resistor 102. Therefore, in the circuit of FIG. 2, it is controlled by the digital signal applied through the control current line 103 whether the bias current I g flows through the Josephson device 101 (corresponding to the operating point A) or through the load resistor 102 (corresponding to the operating point B).

FIG. 3 shows a current distribution in the example shown in FIG. 1. The resistance value of the shunt resistors 111, 112a, 112b, 112c and 112d of the ladder resistor network is set at twice that of the weight resistors 110a, 110b, 110c and 110d. If parallel resistances of the Josephson devices 101a, 101b, 101c and 101d and the load resistors 102a, 102b, 102c and 102d are much smaller than the resistance values of the shunt resistors 111, 112a, 112b, 112c and 112b, the currents passing through the shunt resistors 112a, 112b, 112c, 112d and 111 become ½, ¼, ⅛, 1/16 and 1/16 of the current I b supplied from the current source 120, respectively. These divided currents act as the bias currents for the Josephson devices 101a, 101b, 101c and 101d which are as explained in FIG. 2 controlled by the digital signal of X1, X2, X3 and X4 to drain the bias currents to the superconducting output line 121 or 122. The current I 1 or I 2 flowing through the line 121 or 122 is detected as an analog signal. The currents I 1 and I 2 are complemental and fulfill the following relation:

$$I1 + I2 = (1 - 2^{-n}) I b$$

where n is the number of convesion bit of a digital to analog converter. In the circuit shown in FIG. 1, it is preferable to make smaller the resistance values of the load resistors so that the influence of the switching characteristics of the Josephson device and the load resistors of the ladder resistor network 250 becomes smaller and the bias currents positively flow through the load resistors when the Josephson devices are switched to the voltage state.

Figure 4:
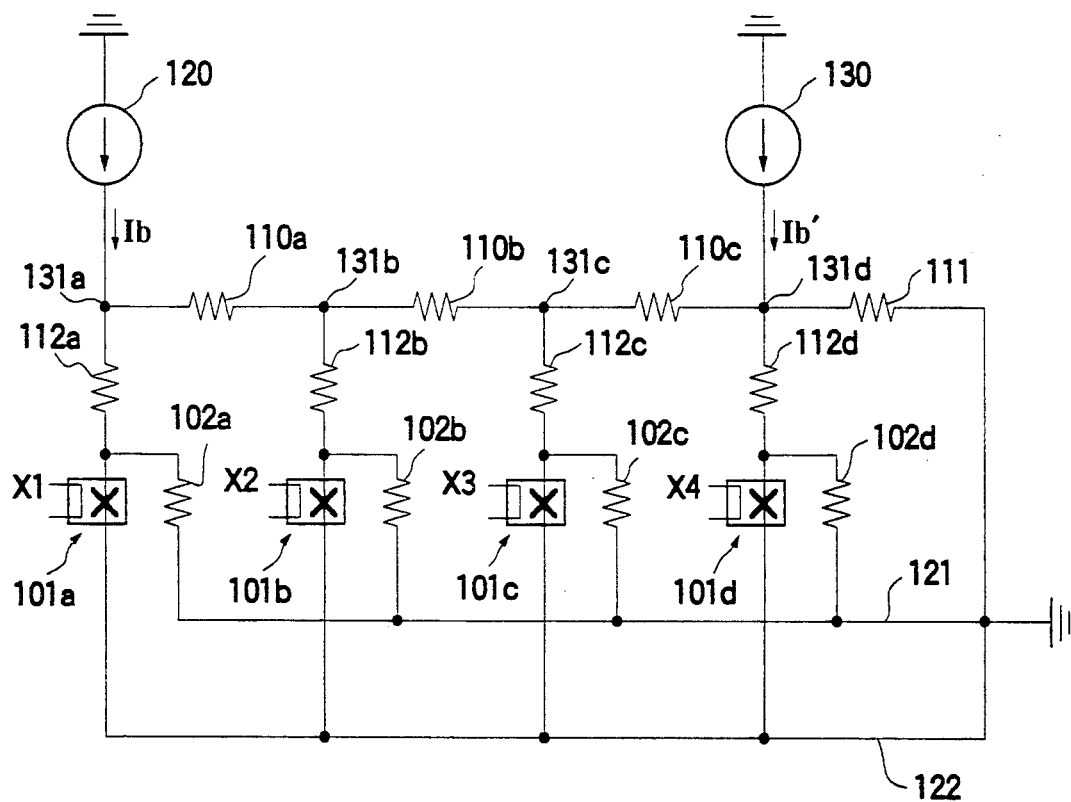
FIG. 4 is a circuit diagram of a first modified example.

FIG. 4 shows another example which is a modification of the example shown in FIG. 1. In the example shown in FIG. 1, it is difficult to switch the states of the Josephson devices from the superconducting state to the voltage state since the bias current I g of the Josephson device for a less significant bit is smaller. In the circuit shown in FIG. 4, in order to easily switch the state of the Josephson device for a less significant bit, another current I b' from a current source 130 is supplied in pulse wise to the Josephson device for the less significant bit at the same time when the digital signal is supplied. In this example, bias currents from the current sources 120 and 130 are supplied when the digital signal is supplied. At this time, sufficient bias currents are supplied to the respective Josephson devices and the states of the Josephson devices are switched to the voltage state by the digital signal. Once the state of the Josephson device becomes the voltage state, the Josephson devices are maintained in the voltage state even after the input signals or part of the bias current is removed. Thus, the states defined by the input signals are retained after the current from the current source 130 become zero. Therefore, the amounts of the currents flowing through the superconducting lines 121 and 122 represent analog signals. In the circuit of FIG. 4, the current source for supplying a current pulse to the least significant bit portion is disclosed. However, it is possible to supply the current pulse to the other intermediate bits.

Figure 5:
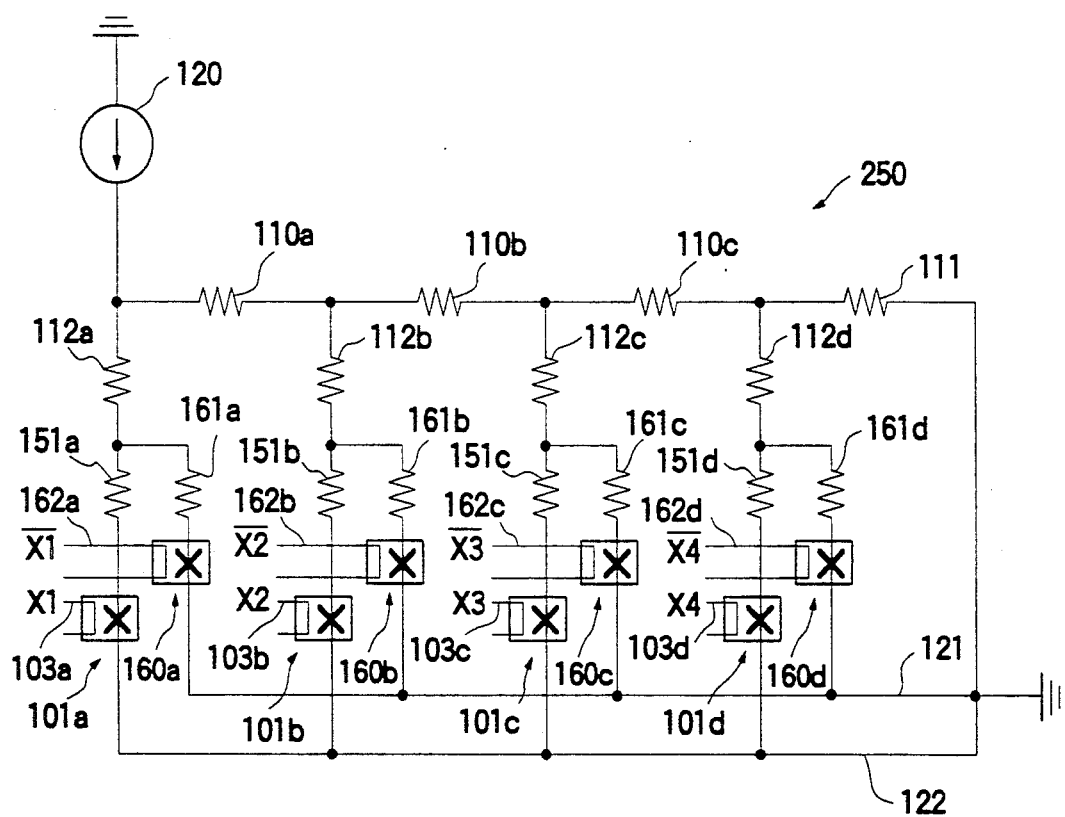
FIG. 5 is a circuit diagram of a second modified example.

FIG. 5 is still another embodiment which is another modification of the example shown in FIG. 1. In the ladder resistor network 250, the resistance value of the shunt resistors 111, 112a, 112b, 112c and 112d is twice that of the weight resistors 110a, 110b and 110c. Thus, the amounts of the currents flowing through the shunt resistors 112a, 112b, 112c, 112d and 111 are ½, ¼, ⅛, 1/16 and 1/16 of the current I b supplied from the current source 120, respectively. Therefore, deviation of the resistance values appears in deviation of the shunt currents' values. In the example shown in FIG. 1, the resistance values of the parallel connections of the Josephson devices 101 and the load resistors 102 are zero while the Josephson devices are in the superconducting state, those are approximately the same as the resistance values of the load resistors while the Josephson devices are in the voltage state. Thus, the resistance values of the parallel connections of the Josephson devices and the load resistors vary with digital signals. This influences the ladder resistor network, that is, the ratio of the shunt currents is changed by the digital signals, and then the accuracy decreases. In the example shown in FIG. 5, two Josephson devices are used for each bit, these two Josephson devices are operated complementarily (positively or negatively) each other. The resistance values of the switch portions are made constant independent of the input digital signals. Thus, it is prevented that the switch portions influence the ladder resistor network. In the example shown in FIG. 5, the shunt resistors 112a, 112b, 112c and 112d of the ladder resistor network are connected respectively with a common end of a serial connection of the resistor 151a and the Josephson device 101a and a serial connection of the resistor 161a and the Josephson devices 160a, a common end of a serial connection of the resistor 151b and the Josephson device 101b and a serial connection of the resistor 161b and the Josephson devices 160b, a common end of a serial connection of the resistor 151c and the Josephson device 101c and a serial connection of the resistor 161c and the Josephson devices 160c, and a common end of a serial connection of the resistor 151d and the Josephson device 101d and a serial connection of the resistor 161d and the Josephson device 160d. Other ends of the serial connections with the Josephson devices 101a, 101b, 101c and 101d are connected to the superconducting output line 122, and other ends of the serial connections with Josephson devices 160a, 160b, 160c and 160d are connected to the superconducting line 121. The Josephson devices 101a, 101b, 101c and 101d are supplied with positive signals X1, X2, X3 and X4 of a digital signal through the control current lines 103a, 103b, 103c and the Josephson devices 160a, 160b, 160c and 160d are supplied with negative signals $\overline{X1}$, $\overline{X2}$, $\overline{X3}$ and $\overline{X4}$ of the digital signal through the control current lines 162a, 162b, 162c and 162d.

Figure 6:
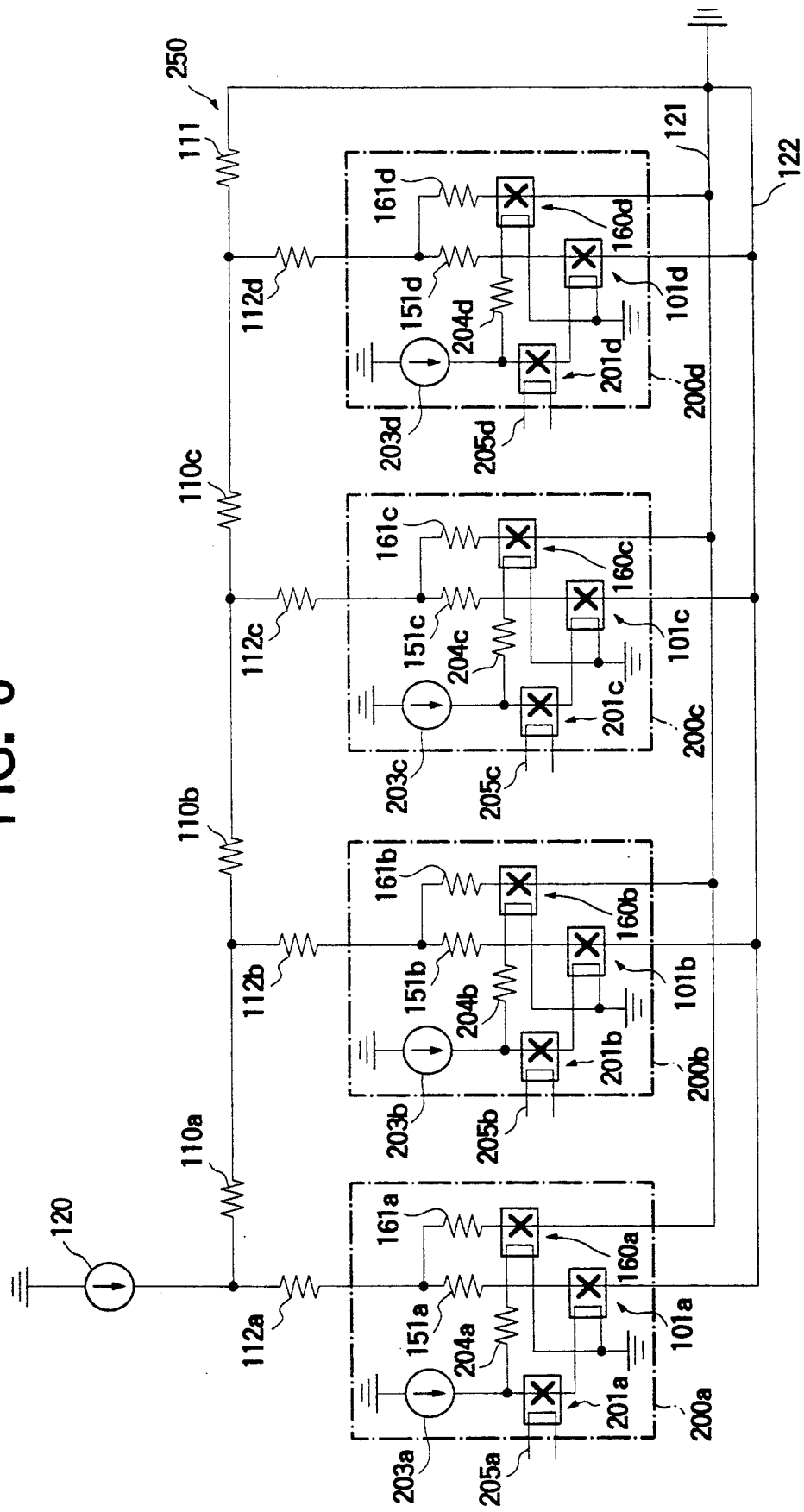
FIG. 6 is a circuit diagram showing means for generating input signals.

FIG. 6 shows means for generating the positive and negative signals of a digital signal for the circuit shown in FIG. 5. The circuit in FIG. 6 has a construction for supplying bias currents from current sources 203 to parallel connections of Josephson devices 201 and load resistors 204. The digital signal is supplied to the Josephson devices through the control current line 205. In the circuit configuration, the bias current supplied from the current sources 203 flow through the Josephson devices 201 or the load resistors 204. The currents flowing through the load resistors 204 are the positive signals of the digital signal whereas the currents flowing through the Josephson devices 201 are negative signals thereof. These positive and negative signals are supplied to the Josephson devices 101 and 160. The switch portions 200a, 100b, 200c and 200d as constructed above are connected to the ladder resistor network 250.

In the examples above explained, the magnetic flux coupled Josephson devices are used as the Josephson devices, but, an identical analog to digital converter can be constructed by using the direct coupled Josephson devices (such as the current injection Josephson device).

As described above, according to this invention, very simple, very high accurate and very high speed digital to analog converters can be obtained. Therefore, by using this invention, very high speed signal processing systems and very high performance hybrid computers are realized. It can be said that this invention is indispensable for the highly advanced information technology.

It will be apparent to those skilled in the art that various other modifications and variations could be made without parting from the scope or the content of the invention.

What is claimed is:

1. A superconducting digital to analog converter comprising:
   a ladder resistor network having a plurality of weight resistors and a plurality of shunt resistors,
   a first current source for supplying current to the ladder resistor network, and
   a plurality of first current switch portions, each having at least one Josephson device, the conduction state of which is switched between a superconducting state and a voltage state, one input connected to a corresponding shunt resistor and first and second outputs,
   whereby conduction states of the Josephson devices are switched by a digital signal to change the outputs of the first current switch portions and currents passed through the first or second outputs are collected to form an analog signal corresponding to the digital signal.

2. The superconducting digital to analog converter claimed in claim 1 wherein, each of said first current switch portions comprises a parallel connection of a Josephson device and a load resistor.

3. The superconducting digital to analog converter claimed in claim 1 wherein, each of said first current switch portions comprises a parallel connection of two Josephson devices to which positive and negative signals of one bit of a digital signal are applied, respectively.

4. The superconducting digital to analog converter claimed in claim 3 further comprising a plurality of second switch portions for supplying currents from other current sources to other Josephson devices and load resistors, whereby currents flowing through the Josephson devices of the second switch portions and currents flowing through the load resistors are applied to the two Josephson devices of the first switch portions.

5. The superconducting digital to analog converter claimed in claim 1 wherein, resistance values of the weight resistors are half resistance values of the shunt resistors.

6. The superconducting digital to analog converter claimed in claim 1 further comprising a second current source for supplying current in pulse wise to the ladder resistor network, wherein the digital signal is applied when currents from the first current source and the second current source are supplied, and then the current from the second current source is cut off.

* * * * *